US006622286B1

(12) United States Patent
Ngo et al.

(10) Patent No.: US 6,622,286 B1
(45) Date of Patent: Sep. 16, 2003

(54) INTEGRATED ELECTRONIC HARDWARE FOR WAFER PROCESSING CONTROL AND DIAGNOSTIC

(75) Inventors: Tuan Ngo, Milpitas, CA (US); Farro Kaveh, Palo Alto, CA (US); Connie Lam, Los Altos, CA (US); Chung-Ho Huang, Fremont, CA (US); Tuqiang Ni, Fremont, CA (US); Anthony T. Le, San Jose, CA (US); Steven Salkow, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 188 days.

(21) Appl. No.: 09/608,599

(22) Filed: Jun. 30, 2000

(51) Int. Cl.[7] .............................................. G06F 17/50
(52) U.S. Cl. .............................. 716/1; 716/19; 700/121
(58) Field of Search ...................... 716/1–21; 427/533, 427/569, 570, 573, 575, 578; 73/201, 299, 767; 702/116, 119, 183; 700/1, 90, 95, 96, 108, 121

(56) References Cited

U.S. PATENT DOCUMENTS

| 4,962,338 | A |   | 10/1990 | Daggett et al. ........ 318/568.11 |
| 5,270,627 | A |   | 12/1993 | Rehse ........................ 318/575 |
| 5,280,983 | A |   | 1/1994  | Maydan et al. .......... 294/119.1 |
| 5,339,436 | A |   | 8/1994  | Tairaku et al. ............... 395/700 |
| 5,666,381 | A |   | 9/1997  | Mokuo ........................ 375/259 |
| 6,205,409 | B1 | * | 3/2001  | Zvonar ....................... 702/183 |
| 6,220,091 | B1 | * | 4/2001  | Chen et al. .................... 73/302 |
| 6,229,116 | B1 | * | 5/2001  | Shirakawa et al. ......... 219/390 |
| 6,358,573 | B1 | * | 3/2002  | Raoux et al. ............... 427/578 |

FOREIGN PATENT DOCUMENTS

WO            99/03133          1/1999        ........... H01L/21/00

OTHER PUBLICATIONS

Kim et al, "Real–Time Diagnosis of Semiconductor Manufacturing Equipment Using a Hybrid Neural Network Expert System," IEEE, Jan. 1997, pp. 39–47.*

Vivek Bakshi, "Benchmarking Of Commercial Software For Fault Detection and Classification (FDC) Of Plasma Etchers for Semiconductor Manufacturing Equipment," IEEE, Jun. 1997, pp. 15–79–1582.*

Rashap et al, "Control of Semiconductor Manufacturing Equipment: Real–Time Feedback Control of a Reactive Ion Etcher," IEEE Aug. 1995, pp. 286–297.*

* cited by examiner

Primary Examiner—Vuthe Siek
(74) Attorney, Agent, or Firm—Thelen Reid & Priest LLP; Thierry K. Lo

(57) ABSTRACT

A central controller for use in a semiconductor manufacturing equipment integrates a plurality of controllers with an open architecture allowing real-time communication between the various control loops. The central controller includes at least one central processing unit (CPU) executing high level input output (i/o) and control algorithms and at least one integrated i/o controller providing integrated interface to sensors and control hardware. The integrated i/o controller performs basic i/o and low level control functions and communicates with the CPU through a bus to perform or enable controls of various subsystems of the semiconductor manufacturing equipment.

10 Claims, 5 Drawing Sheets

INTEGRATED ELECTRONIC HARDWARE FOR WAFER PROCESSING CONTROL AND DIAGNOSTIC

BACKGROUND OF THE INVENTION

1. Field of the Invention

The present invention relates to plasma processing of semiconductor devices. More particularly, the present invention relates to an apparatus for integrating sensors and hardware controls used in a semiconductor manufacturing equipment, specifically, in a plasma etching system.

2. Background Art

Various forms of processing with ionized gases, such as plasma etching/deposition and reactive ion etching/deposition, are increasing in importance particularly in the area of semiconductor device manufacturing. Of particular interest are the devices used in the etching process. FIG. 1 illustrates a conventional inductively coupled plasma etching system 100 that may be used in the processing and fabrication of semiconductor devices. Inductively coupled plasma processing system 100 includes a plasma reactor 102 having a plasma chamber 104 therein. A transformer coupled power (TCP) controller 106 and a bias power controller 108 respectively control a TCP power supply 110 and a bias power supply 112 influencing the plasma created within plasma chamber 104.

TCP power controller 106 sets a set point for TCP power supply 110 configured to supply a radio frequency (RF) signal, tuned by a TCP match network 114, to a TCP coil 116 located near plasma chamber 104. A RF transparent window 118 is typically provided to separate TCP coil 116 from plasma chamber 104 while allowing energy to pass from TCP coil 116 to plasma chamber 104.

Bias power controller 108 sets a set point for bias power supply 112 configured to supply a RF signal, tuned by a bias match network 120, to an electrode 122 located within the plasma reactor 104 creating a direct current (DC) bias above electrode 122 which is adapted to receive a substrate 124, such as a semi-conductor wafer, being processed.

A gas supply mechanism 126, such as a pendulum control valve, typically supplies the proper chemistry required for the manufacturing process to the interior of plasma reactor 104. A gas exhaust mechanism 128 removes particles from within plasma chamber 104 and maintains a particular pressure within plasma chamber 104. A pressure controller 130 controls both gas supply mechanism 126 and gas exhaust mechanism 128.

A temperature controller 134 controls the temperature of plasma chamber 104 to a selected temperature setpoint using heaters 136, such as heating cartridges, around plasma chamber 104.

In plasma chamber 104, substrate etching is achieved by exposing substrate 104 to ionized gas compounds (plasma) under vacuum. The etching process starts when the gases are conveyed into plasma chamber 104. The RF power delivered by TCP coil 116 and tuned by TCP match network 110 ionizes the gases. The RF power, delivered by electrode 122 and tuned by bias match network 120, induces a DC bias on substrate 124 to control the direction and energy of ion bombardment of substrate 124. During the etching process, the plasma reacts chemically with the surface of substrate 124 to remove material not covered by a photoresistive mask.

Primary parameters such as plasma reactor settings are of fundamental importance in plasma processing. The amount of actual TCP power, bias power, gas pressure, gas temperature, and gas flow within plasma chamber 104 greatly affects the process conditions. Significant variance in actual power delivered to plasma chamber 104 may unexpectedly change the anticipated value of other process variable parameters such as neutral and ionized particle density, temperature, and etch rate.

In existing plasma etch systems, however, primary parameters are controlled through separate standalone controllers that do not directly communicate with each other in real-time. FIG. 2 illustrates a conventional plasma etching control hardware system. A TCP match 200 includes a TCP controller 202. A bias match 204 includes a bias controller 206. A pressure control valve 208 includes a pressure controller 210. An optical emission spectrometer (OES) or interferometer (INTRF) 212 includes an OES or INTRF controller 214. A VME chassis 216 communicates with standalone controllers 202, 206, 210, and 214 via serial links 218. Thus, reactor settings are controlled separately through standalone controllers with a relatively slow communication link between each other.

In plasma etching systems, a change in one of the parameters may affect the other parameters. For example, during a process, chemical reactions in the chamber cause the plasma impedance to vary affecting the power delivery, temperature, and pressure. Thus, elaborate discreet recipe steps need to be developed by an operator to effectively de-couple these effects. This generally limits the operating process window, and increases the processing time, affecting the plasma etching system throughput potential. Furthermore, the first wafer effect (the process of a first wafer within a same plasma reactor causes changes in the plasma reactor that affect subsequent processes), and the ever present process drift over time (plasma reactors used over a period of time lose their accuracy because of their prolonged usage) are also indications that the control of reactor settings do not solely control what happens inside the chamber and at the wafer.

A need therefore exists for a method and a device that would centralize all the controls with an open architecture allowing real-time communication between the various controllers. Such a device would allow an operator to significantly improve the stability and repeatability of the etch process, and eventually control the parameters directly relevant to the process therefore directly controlling wafer features.

BRIEF DESCRIPTION OF THE INVENTION

A central controller for use in a semiconductor manufacturing equipment integrates a plurality of controllers with an open architecture allowing real-time communication between the various control loops. The central controller includes at least one central processing unit (cpu) executing high level input output (i/o) and control algorithms and at least one integrated i/o controller providing integrated interface to sensors and control hardware. The integrated i/o controller performs basic i/o and low level control functions and communicates with the CPU through a bus to perform or enable controls of various subsystems of the semiconductor manufacturing equipment.

A method for controlling a plurality of sensors and a plurality of control hardware for use in a semiconductor manufacturing equipment loads an application software onto a cpu board that is plugged in a bus. Sensors and control hardware are linked to electrical controllers that are mounted onto a single circuit board which occupies an address block in a memory space of the bus. The single circuit board is then plugged in the bus and the sensors and control hardware are controlled via the application software.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons having the benefit of this disclosure.

Semiconductor manufacturing equipment such as a plasma etching system uses a computer system to monitor and control wafer transport, gas flow, wafer processing, and wafer stripping.

Figure 1:
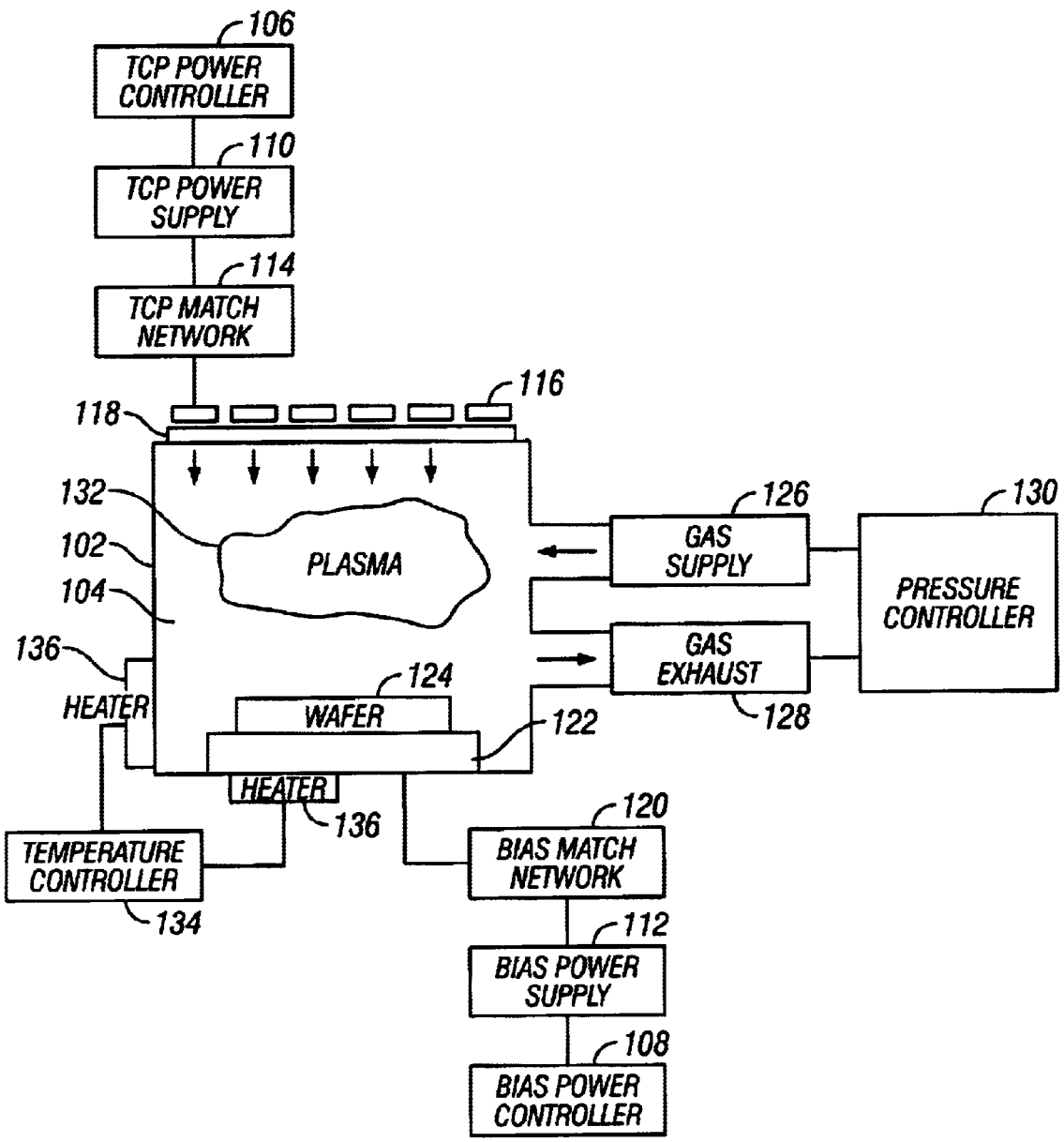
FIG. 1 is a system block diagram illustrating a conventional plasma etching system.
Figure 2:
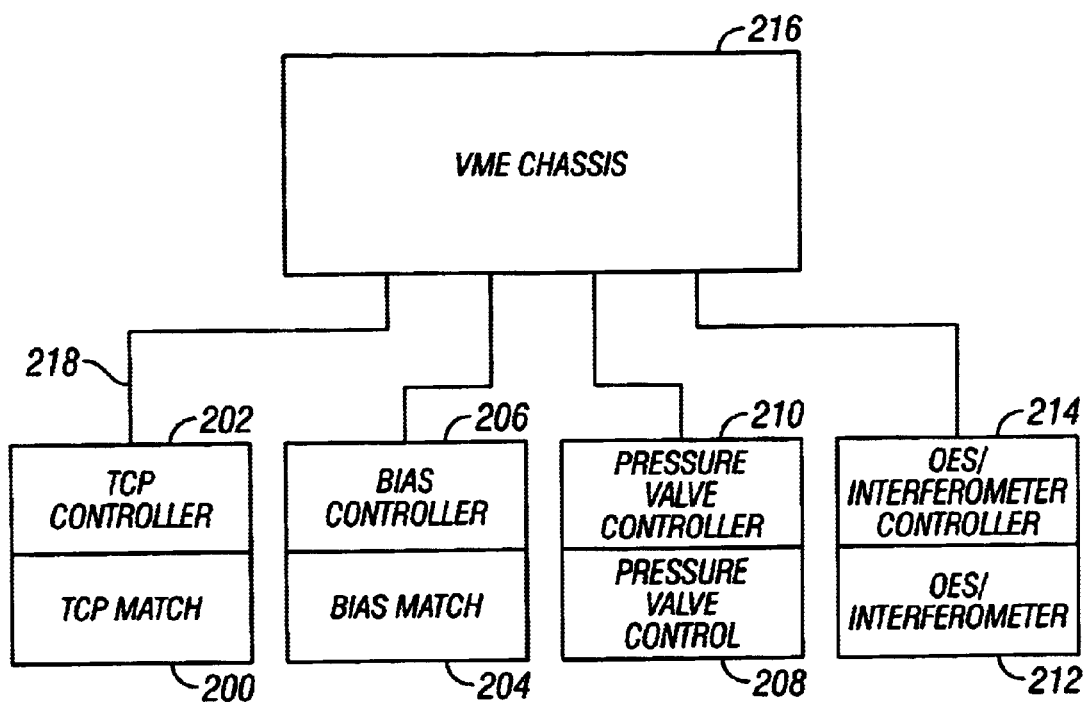
FIG. 2 is a system block diagram illustrating a conventional control hardware environment in a plasma etching system.
Figure 3:
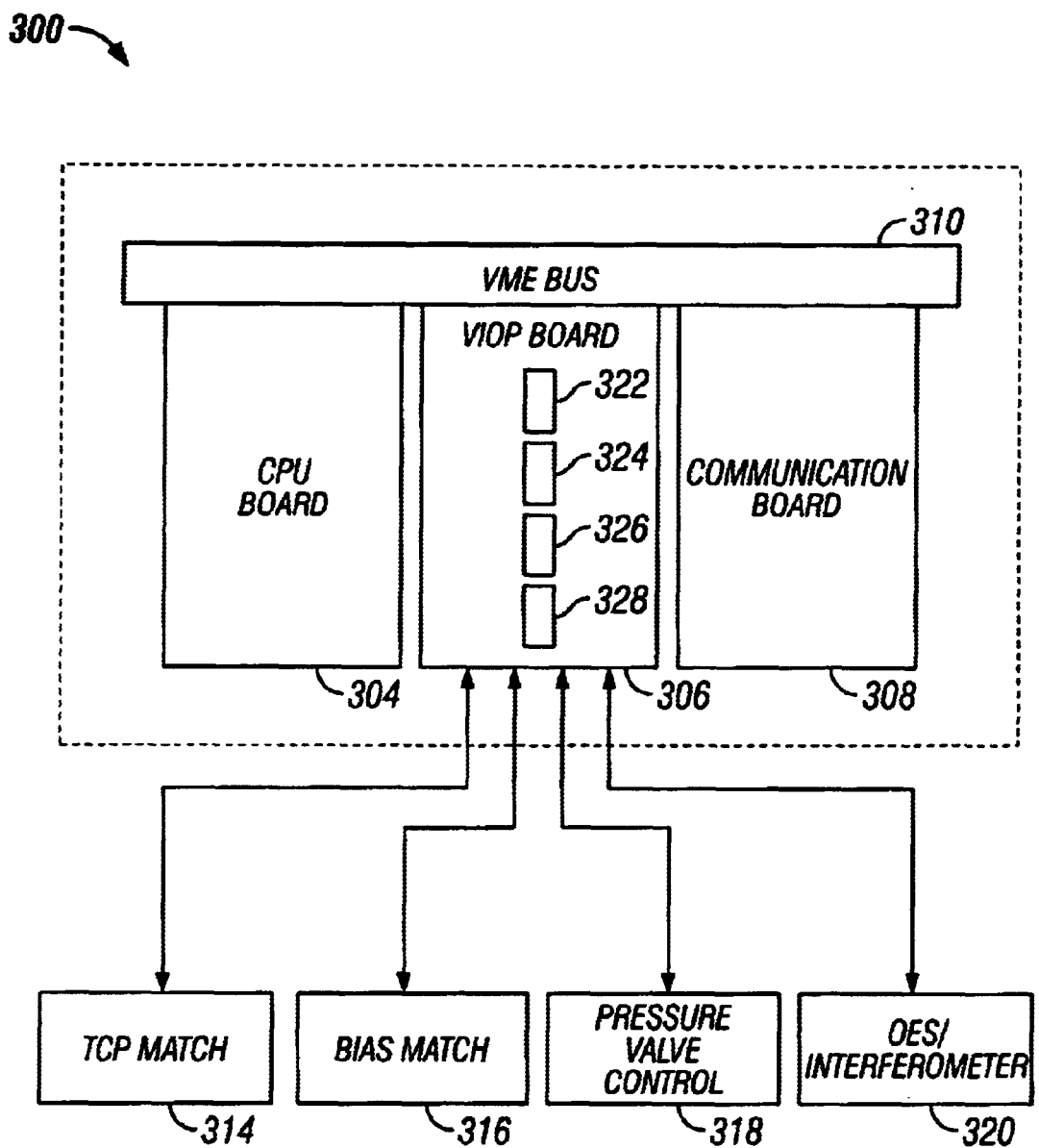
FIG. 3 is a system block diagram illustrating a central hardware controller of an etching system in accordance with a specific embodiment of the present invention.

A hardware control system, which incorporates a preferred embodiment of the present invention, is shown in FIG. 3. It includes a central controller 300 comprising at least one central processing unit (CPU) board 304, at least one circuit board 306, for example a VIOP board, and an optional communication board 308. All boards are plugged in a bus, for example a VME bus 310, within a chassis 312. Communication board 308 interacts with other components of the plasma etching system such as a user interface. Several i/o micro-controllers are mounted on circuit board 306. The i/o micro-controllers communicate with various external control hardware and sensors such as a TCP match 314, a bias match 316, a pressure control valve 318, and an OES or INTRF sensor 320. In particular, two TCP micro-controller 322 located on circuit board 206 controls external TCP match 314. Two bias micro-controller 324 located on circuit board 306 controls external bias match 316. A pressure micro-controller 326 located on circuit board 306 controls external pressure control valve 318. An OES or INTRF controller 328 located on circuit board 306 controls external OES or INTRF sensor 320.

Micro-controllers 322, 324, 326, 328 may be built-in independent stepper controllers that communicate with external drives, i.e. a TCP capacitor drive, a bias match capacitor drive, or a pendulum valve drive. The central controller may also include a built-in interface to an OES, for example an Ocean Optics S2000 spectrometer, or both an OES and an INTRF, for example an Ocean Optics SD2000.

In a reaction chamber, wafer etching is achieved by exposing wafers to ionized gas compounds (plasma) under vacuum. Etching recipes consist of a series of steps controlling gas flow rates, chamber pressure, RF power, gap spacing, chamber temperature, and helium backside cooling pressure. These values are programmed into a computer system. An operator selects the desired recipe before starting the etching process. CPU 304 processes the recipe algorithm by executing a high level i/o and control algorithms and communicates with micro-controllers 322, 324, 326, 328 via VME bus 320. Micro-controllers 322, 324, 326, 328 then perform basic i/o and low level control functions and provide integrated interface to sensors and control hardware 314, 316, 318, 320. Therefore, CPU 304 communicates with micro-controllers 322, 324, 326, 328 via VME bus 310 to perform or enable controls of various subsystems of the plasma etching system such as TCP power, bias power, gas pressure, and OES or INTRF sensors.

Figure 4:
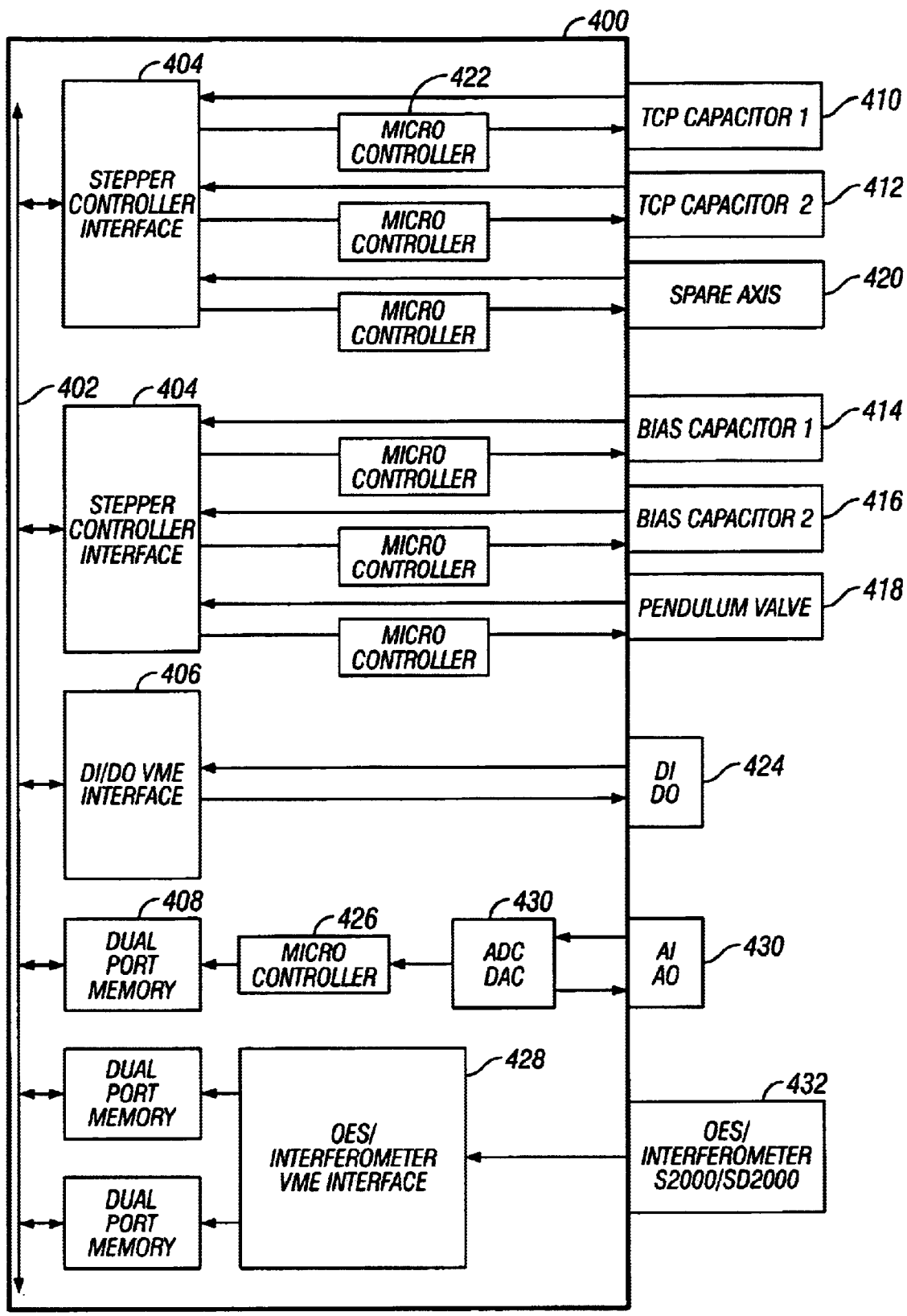
FIG. 4 is a system block diagram illustrating a circuit board in accordance with a specific embodiment of the present invention.

FIG. 4 illustrates a presently preferred embodiment of circuit board 306 (FIG. 3). An i/o processor circuit board 400 may have a 24-bit address and 16-bit data VME bus compatible board occupying an address block of 64 KB in a VME memory space. A bus 402 communicates with stepper controller interfaces 404, digital input (DI) and digital output (DO) VME interface 406, and dual port memories (DPM) 408.

Stepper controller interfaces 404 may include two axis for TCP match 314 (TCP capacitor one 410 and TCP capacitor two 412), two axes for bias match 316 (bias capacitor one 414 and bias capacitor two 416), one axis for pressure control valve 318 (pendulum valve 418), and one spare axis 420. Stepper controller interfaces send commands to micro-controllers 422 that control the axis. Data velocities may be 4 bits for step rate and one bit for direction with multiple rate tables. A micro-controller firmware will automatically implement acceleration/deceleration between the step rate changes.

DI and DO VME interface 406 map DI and DO 424 in a VME memory space. DI may be a 24 volts sourcing type because a source voltage is required from the sensors. DO may be a 24 volts sourcing type and have read-back capability.

DPM 408 communicate with a micro-controller 426 and OES and/or INTRF VME interface 428. Analog inputs (AI) and analog outputs (AO) 430 are directly mapped on a VME memory space by the use of DPM 408. AI 430 are converted by the use of a converter ADC 430 controlled by micro-controller 426. DAC 430 controlled by micro-controller 426 converts digital signals AO 430. VIOP 400 may have 32 AI and 12 AO. The AI may have 12 bits resolution with a range of −10 volts to +10 volts, in particular with a 0.1% accuracy warranted by self-calibration initiated by a host. The AO may have a 12 bit resolution with a 0.1% accuracy in the 0 to 10 volts range and a read-back capability for self-test purpose.

VIOP 300 may also include a VME interface 428 to an OES and/or INTRF 432 where controls and data are mapped on a VME memory space. An OES may be an Ocean Optics S2000. An OES and INTRF may be an Ocean Optics SD2000. The spectrum data may be 12 bits wide with simultaneous acquisition of OES and/or INTRF spectrum. The summation of spectrums may be performed by controller 428, for example a PLD based type, with an integration period programmable from 4 mS to 250 mS in a 1,1.4, 2, 2.8, . . . sequence.

The present invention therefore enables partitioning of control functions for optimum performance. It also facilitates close coupling of time critical loops while allowing "local" control of non-time critical subsystems. Such integrated interface reduces equipment costs by maximizing use of resources and reducing redundesancies in hardware and software. Such an open architecture also allows controllers to coordinate in real-time renders the process stable and consistent.

Figure 5:
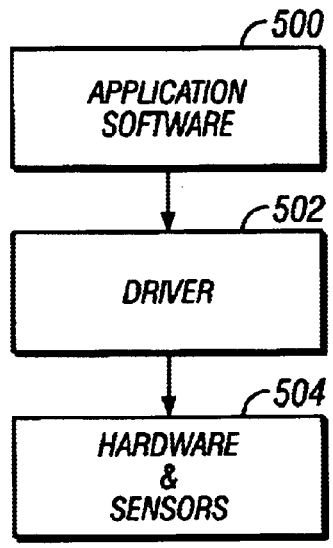
FIG. 5 is a flow chart illustrating the interaction between a software application and sensors and control hardware according to a specific embodiment of the present invention.

FIG. 5 is a flow chart illustrating the interaction between a software application and sensors and control hardware. In block 500, an application software residing on a CPU board, such as CPU board 304, allows an operator to input parameters necessary to create a desired surface profile on a wafer in a plasma etching and deposition reactor. The application software interacts with drivers in block 502. The drivers are low level driver program routines that link the application software in block 500 to the control sensors and control hardware in block 504. Circuit board 306 (FIG. 3) has allocated specific mapping address for every sensor and control hardware. For example, VME memory space FAC2000h-FAC21FFFh has been assigned to VIOP status/control and DI/DO. The drivers can then carry out high level commands from the application software to the specific sensor or control hardware by referencing to the corresponding memory mapping addresses.

Figure 6:
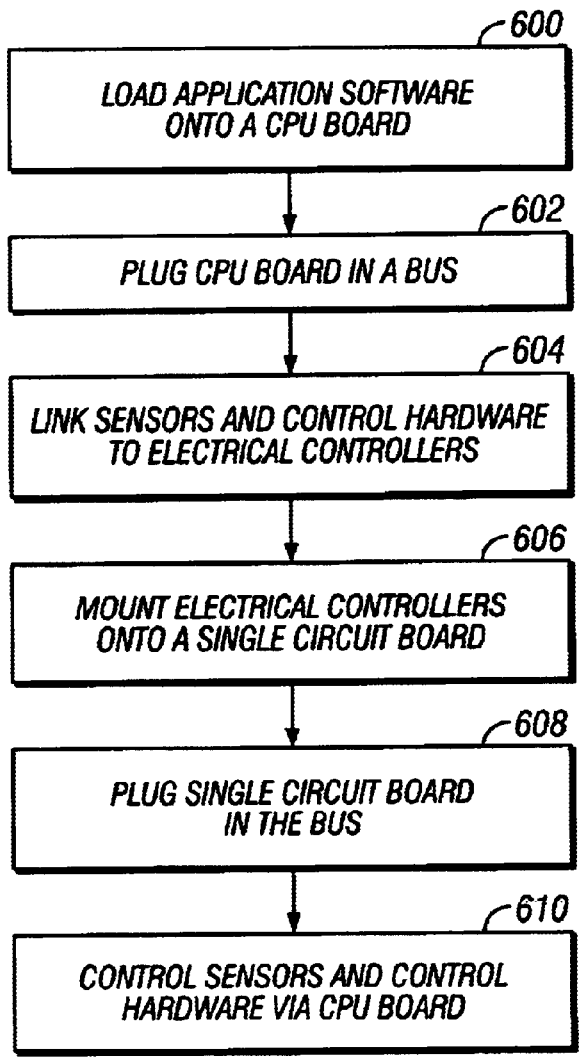
FIG. 6 is a flow chart illustrating a method for controlling sensors and control hardware for use in a semiconductor manufacturing equipment according to a specific embodiment of the present-invention.

A method for controlling sensors and control hardware for use in a semiconductor manufacturing equipment is illustrated in a flow chart in FIG. 6. In a first block 600, an application software allowing an operator to select a recipe containing the specific parameters to produce a desired surface profile in a plasma etching and deposition system, is loaded onto a CPU board, such as CPU board 304 (FIG. 3). In block 602, the CPU board is plugged in a bus, such as VME bus 310. In block 604, sensors and control hardware, such as TCP match 314, bias match 316, pressure control valve 318, and oes/interferometer 320 are linked to micro-controllers. In block 606, electrical controllers, such as micro-controllers 322, 324, 326, and 328, are mounted onto a single circuit board, such as VIOP board 306. The single circuit board is then plugged in the bus in block 608. An operator controls sensors and control hardware via the application software loaded onto CPU board in block 610. Having such central facility of controllers on a single board facilitates a close coupling of a plurality of time critical loops while allowing local control of a plurality of non-time critical subsystems. Other embodiments of the method illustrated in FIG. 6 may have block 600 through 608 rearranged in any order.

Because the micro-controllers on the single circuit board communicate in real-time, they can exchange critical information about the status of a plasma wafer process allowing the CPU to master the whole operation. Such plasma wafer process is orchestrated by the CPU sending high-level instructions to the micro-controllers and interfaces on the single circuit board. Those instructions are then carried out by the micro-controllers that focus on "simple" activities. Such architecture allows the closed loop of each controller to communicate with each other. Because of the multitude of codependent parameters and variables that affect a plasma etching and deposition process, the macroscopic "simultaneous" control of parameters such as TCP, bias, or pressure allows an operator to significantly improve the accuracy, stability, and repeatability of the etch and deposition process.

While embodiments and applications of this invention have been shown and described, it would be apparent to those skilled in the art having the benefit of this disclosure that many more modifications than mentioned above are possible without departing from the inventive concepts herein. For instance, the level of integration of the various control loops onto the integrated i/o board is scalable depending on the specific application that it is intended for. For example, the OES with its low level firmware, may be extracted and combined with a CPU board as a "portable" optical emission spectrometer. This new controller can also be used in the prior art, for enhancement of its existing capability.

Also, for very complex semiconductor manufacturing equipment, multiples of these "central" controllers may be used to optimize controls decomposition, wire harnessing, and space allocation.

The invention, therefore, is not to be restricted except in the spirit of the appended claims.

What is claimed is:

1. A central controller for use in a semiconductor manufacturing equipment comprising:
   a bus;
   at least one central processing unit (CPU) card, said CPU card plugged in said bus and executing at least one high level input/output control algorithm;
   a single circuit board plugged in said bus, said single circuit board including a plurality of interfaces communicating with a plurality of sensors and a plurality of control hardware of said semiconductor manufacturing equipment.

2. The central controller of claim 1 wherein said single circuit board performs basic input/output or low level control functions.

3. The central controller of claim 1 wherein said single circuit board communicates with said CPU through said bus to control said plurality of sensors and said plurality of control hardware of said semiconductor manufacturing equipment.

4. The central controller of claim 1 wherein said bus is a Versa Modular European (VME) bus.

5. A circuit board for use in a semiconductor manufacturing equipment comprising:
   a stepper controller interface communicating with a Versa Modular European bus and a plurality of micro-controllers;
   a digital input and digital output interface communicating with a Versa Modular European bus and mapping said digital input and digital output in a Versa Modular European memory space;
   a first dual port memory communicating with a Versa Modular European bus and mapping an analog input and analog output in a Versa Modular European memory space; and
   a second dual port memory communicating with a Versa Modular European bus and an Optical Emission Spectrometer or Interferometer.

6. A method for controlling a plurality of sensors and a plurality of control hardware for use in a semiconductor manufacturing equipment comprises:
   loading an application software onto a cpu board;
   plugging said cpu board in a bus;
   linking the plurality of sensors and the plurality of control hardware to a plurality of controllers;
   mounting said plurality of controllers onto a single circuit board, said single circuit board occupying an address block in a memory space of said bus;
   plugging said single circuit board in said bus; and
   controlling the plurality of sensors and the plurality of control hardware via said application software.

7. The method as in claim 6 wherein said address block is of 64 kilobytes.

8. The method as in claim 6 wherein said application software communicates with the plurality of sensors and the plurality of control hardware through a plurality of drivers, said plurality of drivers referencing said application software to a plurality of corresponding memory mapping addresses.

9. The method as in claim 6 wherein said plurality of further facilitates a close coupling of a plurality of time critical loops while allowing local control of a plurality of non-time critical subsystems.

10. A program storage device readable by a machine, tangibly embodying a program of instructions readable by the machine to perform a method for controlling a plurality of sensors and a plurality of control hardware for use in a semiconductor manufacturing equipment, the method comprising:

loading an application software onto a cpu board;

plugging said cpu board in a bus;

linking the plurality of sensors and the plurality of control hardware to a plurality of controllers;

mounting said plurality of controllers onto a single circuit board, said single circuit board occupying an address block in a memory space of said bus;

plugging said single circuit board in said bus; and controlling the plurality of sensors and the plurality of control hardware via said application software.

* * * * *

UNITED STATES PATENT AND TRADEMARK OFFICE
CERTIFICATE OF CORRECTION

PATENT NO.     : 6,622,286 B1                                   Page 1 of 1
DATED          : September 16, 2003
INVENTOR(S)    : Tuan Ngo et al.

It is certified that error appears in the above-identified patent and that said Letters Patent is hereby corrected as shown below:

<u>Column 5,</u>
Line 3, replace "redundesancies" with -- redundancies --.

Signed and Sealed this

Second Day of March, 2004

JON W. DUDAS
*Acting Director of the United States Patent and Trademark Office*